United States Patent
Lei et al.

(10) Patent No.: US 12,016,092 B2
(45) Date of Patent: Jun. 18, 2024

(54) GAS DISTRIBUTION CERAMIC HEATER FOR DEPOSITION CHAMBER

(71) Applicant: APPLIED MATERIALS, INC., Santa Clara, CA (US)

(72) Inventors: Pingyan Lei, San Jose, CA (US); Dien-Yeh Wu, San Jose, CA (US); Jallepally Ravi, San Ramon, CA (US); Manjunatha Koppa, Bengaluru (IN); Ambarish Toorihal, Bangalore (IN); Sandesh Yadamane, Bangalore (IN); Vinod Konda Purathe, Bangalore (IN); Xiaoxiong Yuan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 780 days.

(21) Appl. No.: 17/106,735

(22) Filed: Nov. 30, 2020

(65) Prior Publication Data
US 2021/0176831 A1    Jun. 10, 2021

Related U.S. Application Data

(60) Provisional application No. 62/944,180, filed on Dec. 5, 2019.

(51) Int. Cl.
| | |
|---|---|
| *H05B 3/48* | (2006.01) |
| *C23C 14/54* | (2006.01) |
| *C23C 16/455* | (2006.01) |
| *C23C 16/458* | (2006.01) |
| *H05B 3/14* | (2006.01) |

(52) U.S. Cl.
CPC ............ *H05B 3/48* (2013.01); *C23C 14/541* (2013.01); *C23C 16/45565* (2013.01); *C23C 16/4586* (2013.01); *H05B 3/141* (2013.01)

(58) Field of Classification Search
CPC .. H05B 3/48; H05B 3/141; H05B 6/62; C23C 16/4586; C23C 16/45565; C23C 14/541
See application file for complete search history.

(56) References Cited

U.S. PATENT DOCUMENTS

| | | |
|---|---|---|
| 5,948,167 A | 9/1999 | Baek et al. |
| 8,822,345 B2 | 9/2014 | Dhindsa et al. |

(Continued)

FOREIGN PATENT DOCUMENTS

JP    2019/203975 A    11/2019

OTHER PUBLICATIONS

International Search Report and Written Opinion for PCT/US2020/062609 dated Mar. 5, 2021.

*Primary Examiner* — Thien S Tran
(74) *Attorney, Agent, or Firm* — MOSER TABOADA

(57) ABSTRACT

Embodiments of a lid heater for a deposition chamber are provided herein. In some embodiments, a lid heater for a deposition chamber includes a ceramic heater body having a first side opposite a second side, wherein the ceramic heater body includes a first plurality of gas channels extending from one or more first gas inlets on the first side, wherein each of the one or more first gas inlets extend to a plurality of first gas outlets on the second side; a heating element embedded in the ceramic heater body; and an RF electrode embedded in the ceramic heater body proximate the second side, wherein the first plurality of gas channels extend through the RF electrode.

20 Claims, 5 Drawing Sheets

(56) References Cited

U.S. PATENT DOCUMENTS

| | | |
|---|---|---|
| 9,449,795 B2 | 9/2016 | Sabri et al. |
| 10,400,333 B2 | 9/2019 | Sabri et al. |
| 2005/0241765 A1* | 11/2005 | Dhindsa .............. H01J 37/3244 |
| | | 156/345.37 |
| 2006/0071607 A1* | 4/2006 | Chen ................... H01J 37/3222 |
| | | 315/111.01 |
| 2006/0137607 A1 | 6/2006 | Seo et al. |
| 2010/0162956 A1 | 7/2010 | Murakami et al. |
| 2012/0097330 A1 | 4/2012 | Iyengar et al. |
| 2012/0273135 A1 | 11/2012 | Hida et al. |
| 2013/0126206 A1 | 5/2013 | Zhou et al. |
| 2014/0227881 A1* | 8/2014 | Lubomirsky ........... C23C 16/54 |
| | | 156/345.35 |
| 2017/0330728 A1* | 11/2017 | Bravo ............... H01J 37/32082 |
| 2019/0078210 A1 | 3/2019 | Gungor et al. |
| 2021/0363635 A1 | 11/2021 | Rocha-Alvarez et al. |

* cited by examiner

US 12,016,092 B2

GAS DISTRIBUTION CERAMIC HEATER FOR DEPOSITION CHAMBER

CROSS-REFERENCE TO RELATED APPLICATIONS

This application claims benefit of U.S. provisional patent application Ser. No. 62/944,180, filed Dec. 5, 2019 which is herein incorporated by reference in its entirety.

FIELD

Embodiments of the present disclosure generally relate to a substrate processing equipment.

BACKGROUND

Substrate processing systems generally include a process chamber that forms an enclosure having a support pedestal for supporting a substrate, such as a semiconductor substrate, within the enclosure. In some processes, plasma may be used for deposition or etching of materials in the process chamber. A showerhead may be disposed opposite the support pedestal within the enclosure to distribute one or more process gases therethrough. A heater may be disposed proximate the showerhead to heat the showerhead and form a plasma therebetween. However, the inventors have observed non-uniform deposition or etching of materials when a heater is disposed within the enclosure and one or more process gases are injected from a top of the process chamber.

Accordingly, the inventors have provided improved lid heaters for use in the process chamber.

SUMMARY

Embodiments of a lid heater for a deposition chamber are provided herein. In some embodiments, a lid heater for a deposition chamber includes a ceramic heater body having a first side opposite a second side, wherein the ceramic heater body includes a first plurality of gas channels extending from one or more first gas inlets on the first side, wherein each of the one or more first gas inlets extend to a plurality of first gas outlets on the second side; a heating element embedded in the ceramic heater body; and an RF electrode embedded in the ceramic heater body proximate the second side, wherein the first plurality of gas channels extend through the RF electrode.

In some embodiments, a substrate processing apparatus includes a lid heater having a ceramic heater body having a first side opposite a second side, wherein the ceramic heater body includes a first plurality of gas channels extending from one or more first gas inlets on the first side to a plurality of first gas outlets on the second side, wherein the first plurality of gas channels includes a first passageway extending substantially vertically from each of the one or more first gas inlets towards the second side, a plurality second passageways extending radially outward from each first passageway, and a plurality of third passageways extending from each of the plurality of second passageways towards the plurality of first gas outlets; an RF electrode embedded in the ceramic heater body proximate the second side, wherein the first plurality of gas channels extend through the RF electrode; and a heating element embedded in the ceramic heater body.

In some embodiments, a deposition chamber includes a process chamber having a chamber lid and defining a processing volume therein; a support pedestal disposed in the processing volume to support a substrate; a lid heater coupled to the chamber lid, wherein the lid heater includes a ceramic heater body having a first side opposite a second side and a heating element embedded therein, wherein the lid heater includes a first plurality of gas channels extending from one or more first gas inlets on the first side, wherein each of the one or more first gas inlets extend to a plurality of first gas outlets on the second side; and an RF electrode embedded in the ceramic heater body proximate the second side, wherein the first plurality of gas channels extend through the RF electrode.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
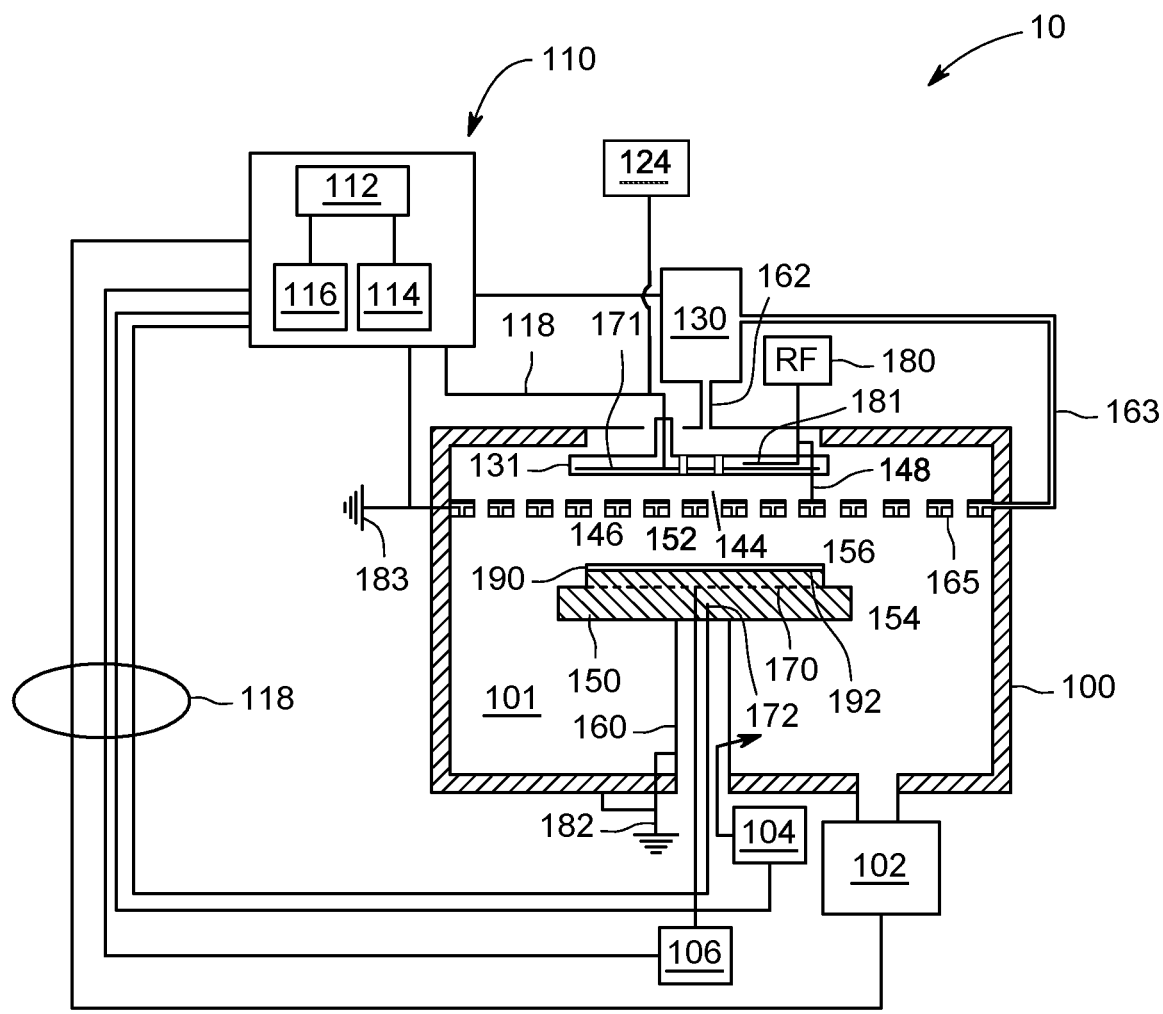
FIG. 1 depicts a schematic side view of a substrate processing apparatus suitable for a lid heater in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of lid heaters made of a ceramic material for a deposition chamber are provided herein. Embodiments of lid heaters described herein advantageously include a plurality of gas distribution channels to more uniformly distribute one or more process gases therethrough. An RF electrode is embedded in the lid heater to facilitate plasma formation adjacent the lid heater.

FIG. 1 depicts a schematic side view of a substrate processing apparatus 10 suitable for a lid heater in accordance with some embodiments of the present disclosure. In some embodiments, the substrate processing apparatus 10 includes a process chamber 100 having a chamber lid, a gas panel 130, a control unit 110, along with other hardware components such as power supplies and vacuum pumps. Exemplary process chambers suitable for modification in accordance with the teachings provided herein include any of several process chambers configured for chemical vapor deposition (CVD) and available from Applied Materials, Inc. of Santa Clara, California Other suitable process chambers from other manufacturers may similarly be used and modified in accordance with the present disclosure.

The process chamber 100 generally comprises a lid heater 131. The lid heater 131 can be used to heat a processing volume 101 including a remote processing volume 144 between the lid heater 131 and a showerhead 165 disposed within the process chamber 100. Depending on the specific process, the remote processing volume 144 may be heated to some desired temperature prior to and/or during processing in accordance with the present disclosure. In some embodiments, the lid heater 131 is heated by an embedded heating element such as heating element 171. For example, the lid heater 131 may be resistively heated by applying an electric current from an AC supply 124 to the heating element 171. The remote processing volume 144 is, in turn, heated by the lid heater 131 and can be maintained within a process temperature range of, for example, 200 to 800 degrees Celsius, or at a first temperature of about 600 degrees Celsius or greater.

In some embodiments, a temperature sensor 146, such as a thermocouple, may be embedded in the lid heater 131 to monitor the temperature of the lid heater 131 in a conventional manner. For example, the measured temperature may be used in a feedback loop to control the power supply for the lid heater 131 such that the temperature of the remote processing volume 144 can be maintained or controlled at a desired temperature that is suitable for a particular process or application.

In some embodiments, the lid heater 131 is configured to provide enough heat to promote remote plasma formation in the remote processing volume 144 between the lid heater 131 and the showerhead 165. In some embodiments, the lid heater 131 is configured to provide enough heat to prevent condensation within or upon the showerhead 165. For example, a control unit 110 may be in communication with the lid heater 131 so that a user can adjust the heat of the lid heater 131 and maintain a heat sufficient for remote plasma formation. In some embodiments, depending upon processing needs, the lid heater 131 is configured not to heat, or promote remote plasma formation, in the remote processing volume 144. For example, the lid heater 131 may be switched off via the control unit 110 depending upon user needs.

In some embodiments, the process chamber 100 generally includes a support pedestal 150 having a support surface 192, which is used to support a substrate 190 such as a semiconductor substrate within the process chamber 100. The support pedestal 150 can be coupled to a hollow support shaft 160 and moved in a vertical direction inside the process chamber 100 using a displacement or lift mechanism (not shown). Depending on the specific process, the substrate 190 may be heated to some desired temperature prior to processing. In some embodiments, the support pedestal 150 is heated by an embedded heating element such as heating element 170. For example, the support pedestal 150 may be resistively heated by applying an electric current from an AC supply 106 to the heating element 170. The substrate 190 is, in turn, heated by the support pedestal 150, and can be maintained within a process temperature range of, for example, 300 to 800 degrees Celsius. In some embodiments, a temperature sensor 172, such as a thermocouple, may be embedded in the support pedestal 150 to monitor the temperature of the support pedestal 150 in a conventional manner. For example, the measured temperature may be used in a feedback loop to control the power supply such as the AC supply 106 for the heating element 170 such that a temperature of the substrate 190 can be maintained or controlled at a desired temperature that is suitable for the particular process or application. In some embodiments, the support pedestal includes a ground at 182.

In some embodiments, the lid heater 131 can include a radio frequency (RF) electrode 181, for example, disposed on or embedded in the lid heater 131. An RF power source 180 can be coupled to the RF electrode 181 to provide RF power to the lid heater 131. RF power can be provided from the RF power source 180 to the RF electrode 181 in an amount sufficient to form a plasma in the remote processing volume 144 between the lid heater 131 and the showerhead 165. For example, the control unit 110 may be in communication with the RF power source 180 so that a user can adjust the RF power provided to the lid heater 131 and to maintain RF power provided in an amount sufficient for plasma formation.

The processing volume 101 includes a direct processing volume 152 disposed between the showerhead 165 and the support pedestal 150. In some embodiments, the showerhead 165 includes a second RF electrode 148 for providing RF energy in an amount sufficient to form a plasma in the direct processing volume 152 and/or in the remote processing volume 144. The second RF electrode 148 can be coupled to the RF power sources 180 or to a second RF power source (not shown). In some embodiments, the second RF electrode 148 may be embedded in the showerhead 165. In some embodiments, at least a portion of the showerhead 165 may be formed of a conductive material suitable to function as the second RF electrode 148. In some embodiments, the showerhead 165 includes the second RF electrode 148 and the lid heater 131 includes the RF electrode 181 for providing RF energy to both the lid heater 131 and the showerhead 165 in an amount sufficient to form a plasma in the remote processing volume 144 between the showerhead 165 and the lid heater 131. In some embodiments, the showerhead 165 may be coupled or selectively coupled to a ground 183 depending upon user needs for plasma placement within the processing volume 101.

The RF electrode 181 and the second RF electrode 148 may be coupled to one or more RF power sources 180 through one or more respective matching networks that can be part of the RF power source or separately provided (separate matching network not shown). The one or more RF power sources 180 may be capable of producing up to 3000 watts of RF energy at a frequency of about 350 kHz to about 60 MHz, such as at about 350 kHz, or about 13.56 MHz, or about 60 Mhz, or the like. In some embodiments, the process chamber 100 may utilize capacitively coupled RF energy for plasma processing. For example, the process chamber 100 may have a ceiling made from dielectric materials and a showerhead 165 that is at least partially conductive to provide the second RF electrode 148 (or a separate RF electrode may be provided). The showerhead 165 (or separate RF electrode) may be coupled to one or more RF power sources 180 through one or more respective matching networks (not shown). The one or more RF power sources 180 may be capable of producing up to about 3,000 watts, or in some embodiments, up to about 5,000 watts, of RF energy at a frequency of about 350 kHz to about 60 MHz, such as at about 350 kHz, or about 13.56 MHz, or about 60 Mhz, or the like.

In use, the control unit 110 may be in communication with the RF power sources 180, or the RF power sources 180 and the second RF power source (not shown) so that a user can adjust RF power provided to at least one of the showerhead 165 and the lid heater 131 to maintain RF power sufficient for plasma formation in at least one of the remote processing volume 144 or the direct processing volume 152. For example, in some embodiments, a plasma may be formed in the remote processing volume 144 by grounding the showerhead 165 (e.g., coupling the showerhead 165 to the ground 183) and providing sufficient RF power to the RF electrode 181 to ignite and/or maintain a plasma in the remote processing volume 144. In some embodiments, a plasma may be formed in the direct processing volume 152 providing sufficient RF power to the showerhead 165, and more particularly the second RF electrode 148, to ignite and/or maintain a plasma in the direct processing volume 152. In such embodiments, the showerhead 165 is not grounded (e.g., is not coupled to the ground 183).

In some embodiments, proper control and regulation of gas flows through the process chamber 100 and gas panel 130 is performed by mass flow controllers (not shown) and the controller unit 110. The showerhead 165 allows process gases from the gas panel 130 to be uniformly distributed and introduced into the process chamber 100. In some embodiments, the showerhead 165 is configured for flowing reaction products (such as reaction products suitable for forming a titanium material layer as described herein) into the process chamber to selectively form a desired material layer, such as a titanium material layer, upon a surface, such as a silicon surface, of the substrate.

Illustratively, the control unit 110 includes a central processing unit (CPU) 112, support circuitry 114, and memory 116 containing associated control software. The control unit 110 is responsible for automated control for processing the substrate 190 such as substrate transport, gas flow control, temperature control, chamber evacuation, and so on. Bidirectional or unidirectional communication between the control unit 110 and the various components of the substrate processing apparatus 10 are handled through numerous signal cables collectively referred to as signal buses 118, some of which are illustrated in FIG. 1.

In some embodiments, the process chamber 100 includes a vacuum pump 102 to evacuate the process chamber 100 and to maintain the proper gas flows and pressure inside the process chamber 100. The showerhead 165, through which process gases are introduced into the process chamber 100, is located above the support pedestal 150. In some embodiments, the showerhead 165 may be configured as a multiple gas showerhead having two or more separate pathways, which allow two or more gases to be separately introduced into the processing chamber 100 without premixing. In some embodiments, the showerhead 165 is connected to the gas panel 130 which controls and supplies, through mass flow controllers (not shown), various gases used in different steps of the process sequence. During substrate processing, a purge gas supply 104 also provides a purge gas, for example, an inert gas, around the bottom of the support pedestal 150 to minimize undesirable deposits from forming on the support pedestal 150.

A first gas flow line 162 is coupled to the lid heater 131 and is configured to provide gas flow from the gas panel 130 to the lid heater 131. The gas provided to the lid heater 131 from the first gas flow line 162 advantageously flows through the lid heater 131, as described in more detail below, and provides a more uniform gas flow to the direct processing volume 152 through first gas distribution openings 156 in the showerhead 165 that pass completely through the showerhead 165. In some embodiments, a second gas flow line 163 is coupled to the showerhead 165 and is configured to provide a second gas flow from the gas panel 130 to the direct processing volume 152 via internal passageways 154 of the showerhead 165 that are advantageously fluidly independent from the first gas distribution openings 156 in the showerhead 165 and that extend to a substrate-facing side of the showerhead 165.

In some embodiments, the control unit 110 is responsible for controlling gas flow from gas panel 130 to the remote processing volume 144 by the first gas flow line 162, or within the showerhead 165 by the second gas flow line 163. In some embodiments, process chamber 100 is configured such that the gas panel 130 provides titanium tetrachloride ($TiCl_4$), hydrogen ($H_2$) and/or argon (Ar) inside process chamber 100 and processing volume 101. In some embodiments, one or more desired gases may be directed from the gas panel 130 into the direct processing volume 152 through the showerhead 165 via the second gas flow line 163. For example, in some embodiments, one or more of silane such as $SiH_4$, disilane such as $Si_2H_6$, hydrogen ($H_2$), or argon (Ar) gases may be added to processing volume 101 by the second gas flow line 163.

In some embodiments, such as where the processing chamber 100 is configured for remote plasma application, e.g., igniting plasma in the remote processing volume 144, or within showerhead 165, one or more desired gases such as titanium tetrachloride ($TiCl_4$), hydrogen ($H_2$) and/or argon (Ar) may be directed from gas panel 130 into processing volume 101 via the first gas flow line 162, and one or more desired gases such as silane such as $SiH_4$, or hydrogen ($H_2$), or argon (Ar) gases may be directed to processing volume 101 by the second gas flow line 163. In some embodiments, the flow rate, temperature, and pressure of the processing volume can be adjusted to values sufficient for a reaction desired in accordance with the present disclosure.

In some embodiments, such as where processing chamber 100 is configured for direct plasma application, e.g., igniting plasma in the direct processing volume 152 one or more desired gases such as nitrogen ($N_2$), hydrogen ($H_2$) or argon (Ar) may be directed from the gas panel 130 into the processing volume 101 via the first gas flow line 162, and one or more desired gases such as argon (Ar) may be directed to processing volume 101 by the second gas flow line 163. In some embodiments, the flow rate, temperature, and pressure of the processing volume can be adjusted to values sufficient for a reaction desired in accordance with the present disclosure.

Figure 2:
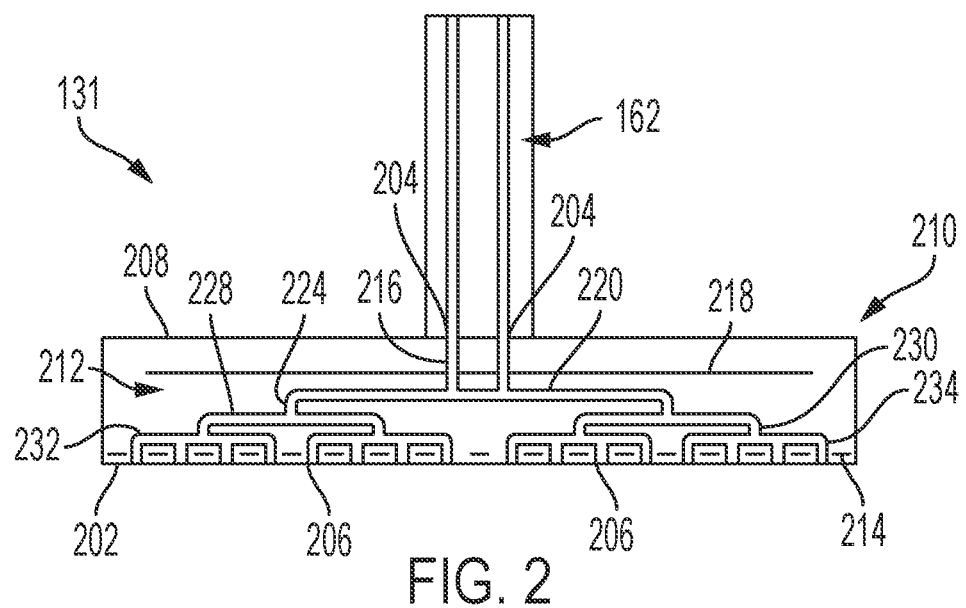
FIG. 2 depicts a schematic side view of a lid heater in accordance with some embodiments of the present disclosure.
Figure 3:
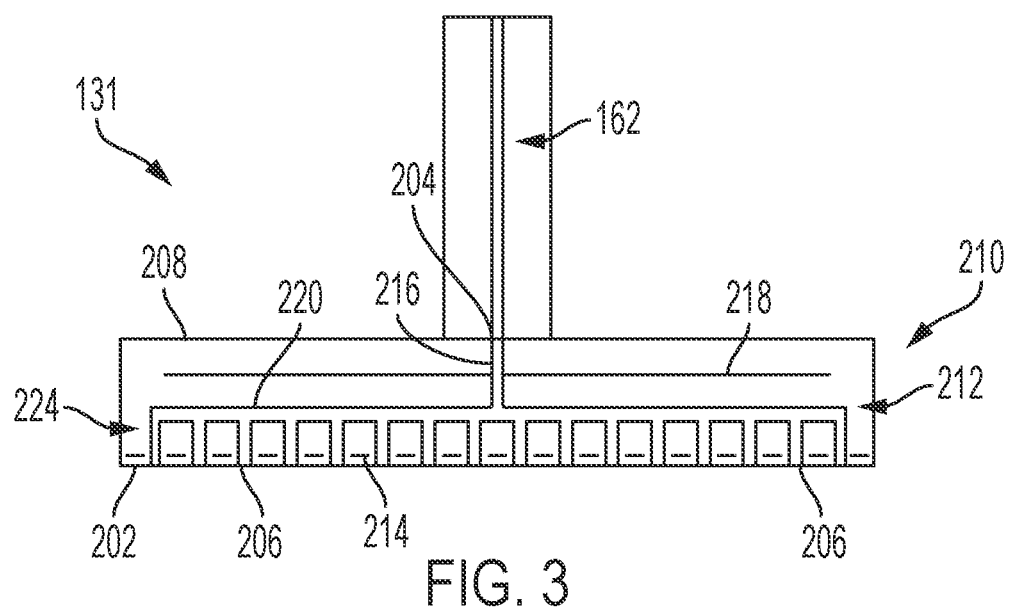
FIG. 3 depicts a schematic side view of a lid heater in accordance with some embodiments of the present disclosure.

FIGS. 2 and 3 depict schematic side views of a lid heater 131 in accordance with some embodiments of the present disclosure. The lid heater 131 includes a heater body 210 made of a ceramic material. In some embodiments, the heater body 210 is made of aluminum nitride (AlN) or aluminum oxide ($Al_2O_3$). The heater body 210 includes a first side 208 opposite a second side 202. The heater body 210 may be a singular body or may comprise a plurality of plates having channels to define a plurality of gas distribution channels when bonded or coupled together.

In some embodiments, the plurality of gas distribution channels include a first plurality of gas channels 212 extending from one or more first gas inlets 204 on the first side 208. Each of the one or more first gas inlets 204 extend to a plurality of first gas outlets 206 on the second side 202. In the illustrative embodiment of FIG. 2, the one or more first gas inlets 204 comprise two first gas inlets. Any embodiments of the lid heater 131 disclosed herein may have one, two, or more first gas inlets 204. In some embodiments, as shown in FIG. 2, the first gas flow line 162 comprises two or more lines that are fluidly coupled to two or more corresponding gas inlets of the one or more first gas inlets 204. In some embodiments, two or more first gas inlets 204 advantageously enhance gas distribution from the first gas flow line 162 through the first plurality of gas channels 212. In some embodiments, the first gas outlets 206 have a diameter of about 0.02 inches to about 0.10 inches.

The first plurality of gas channels 212 are advantageously configured to dispense a gas flow from a gas source (e.g., gas panel 130) to adjacent the second side 202 of the lid heater 131 in a uniform manner. In some embodiments, the first plurality of gas channels 212 have a recursive flow path having a substantially equal flow path length from each of the one or more first gas inlets 204 to multiple ones of the plurality of first gas outlets 206. In some embodiments, the first plurality of gas channels 212 define a recursive flow path having a substantially equal conductance from the one or more first gas inlet 204 to multiple ones of the plurality of first gas outlets 206.

In some embodiments, the first plurality of gas channels 212 includes a first passageway 216 that extends from each of the one or more first gas inlets 204 towards the second side 202. In some embodiments, the first passageway 216 extends substantially vertically. The first plurality of gas channels 212 includes a plurality of second passageways 220 extending radially outward from each first passageway 216. A plurality of third passageways 224 extend from each of the plurality of second passageways 220 towards the second side 202 of the lid heater 131. In some embodiments, the plurality of third passageways 224 extend from each of the second passageways 220 to the plurality of first gas outlets 206. In some embodiments, the plurality of third passageways 224 have a cross-sectional area that is less than a cross-sectional area of the plurality of second passageways 220.

In some embodiments, the first plurality of gas channels 212 have a circular cross-section. In some embodiments, the first plurality of gas channels 212 have a circular cross-section having a diameter of about 2.0 mm to about 12.0 mm. In some embodiments, the first plurality of gas channels 212 have a rectangular cross-section. In some embodiments, the first plurality of gas channels 212 have a rectangular cross-section having a width of about 2.0 mm to about 12.0 mm.

In some embodiments, the first plurality of gas channels 212 include a plurality of fourth passageways 228 that extend horizontally outward from each of the plurality of third passageways 224, and a plurality of fifth passageways 230 that extend substantially vertically from each of the plurality of fourth passageways 228 towards the second side 202 of the lid heater 131. In some embodiments, the plurality of fifth passageways 230 extend to the plurality of first gas outlets 206. In some embodiments, as shown in FIG. 2, a plurality of sixth passageways 232 extend horizontally outward from each of the plurality of fifth passageways 230, and a plurality of seventh passageways 234 extend vertically from each of the sixth passageways 232 to the plurality of first gas outlets 206. In some embodiments, as shown in FIG. 3, the plurality of third passageways 224 extend substantially vertically from each of the plurality of second passageways 220 to the plurality of first gas outlets 206

An RF electrode 214 is embedded in the heater body 210. The RF electrode 214 is the RF electrode 181 described above with respect to FIG. 1. The first plurality of gas channels 212 extend through the RF electrode 214. In some embodiments, the RF electrode 214 comprises a conductive plate with openings through which the first plurality of gas channels 212 extend. In some embodiments, the RF electrode 214 comprises a conductive mesh through which the first plurality of gas channels 212 extend. In some embodiments, the RF electrode 214 is disposed proximate the second side 202, for example about 0.5 mm to about 1.5 mm from the second side 202, to facilitate forming a plasma adjacent the second side 202.

A heating element 218 is embedded in the heater body 210. In some embodiments, the heating element 218 is the heating element 171 of FIG. 1. The heating element 218 is generally disposed between the RF electrode 214 and the first side 208. In some embodiments, the heating element 218 is approximately centrally located between the first side 208 and the second side 202 to uniformly heat the heater body 210. In some embodiments, the heating element 218 is disposed in an upper half of the heater body 210 so that the heating element 218 does not interfere with the first plurality of gas channels 212. In some embodiments, the first passageway 216 extends through the heating element 218. In some embodiments, the heating element 218 is disposed between the plurality of second passageways 220 and the first side 208.

Figure 4:
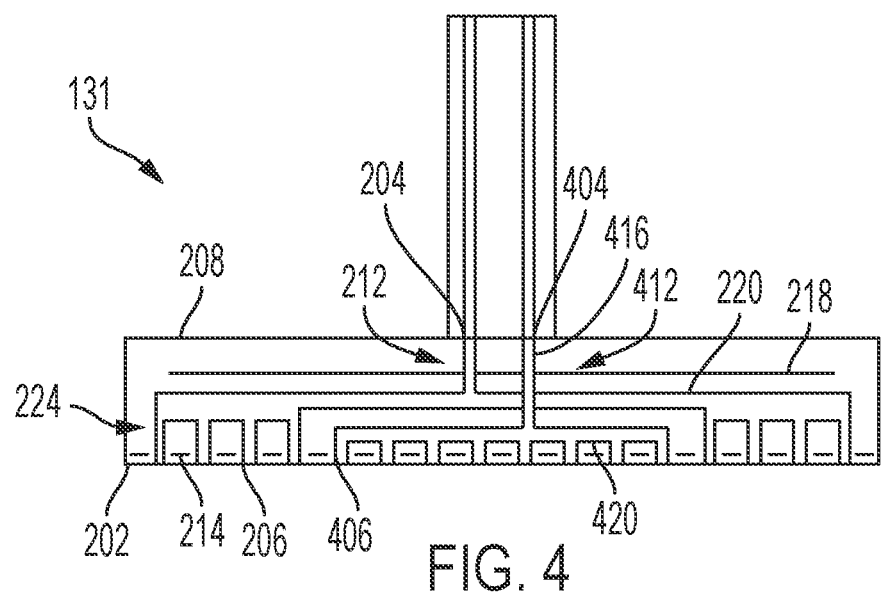
FIG. 4 depicts a schematic side view of a lid heater in accordance with some embodiments of the present disclosure.

FIG. 4 depicts a schematic side view of a lid heater 131 in accordance with some embodiments of the present disclosure. In some embodiments, the lid heater 131 is configured to flow two or more process gases (e.g., from gas panel 130) therethrough without mixing. In some embodiments, the lid heater 131 includes a second plurality of gas channels 412 that are fluidly independent of the first plurality of gas channels 212. In some embodiments, the heater body 210 includes a second plurality of gas channels 412 extending from one or more second gas inlets 404 (only one shown in FIG. 4) on the first side 208 to a plurality of second gas outlets 406 on the second side 202. In some embodiments, the second plurality of gas channels 412 extend through the RF electrode 214.

In some embodiments, the plurality of second gas outlets 406 are disposed radially inward of the plurality of first gas outlets 206. In some embodiments, the plurality of second gas outlets 406 are disposed radially outward of the plurality of first gas outlets 206. In some embodiments, the plurality of second gas outlets 406 and the plurality of first gas outlets 206 are arranged in an alternating pattern from a center of the heater body 210 to an outer sidewall of the heater body 210. In some embodiments, the second plurality of gas channels 412 have a cross-sectional size and shape similar to those discussed above with respect to the first plurality of gas channels 212. In some embodiments, the second plurality of gas channels 412 have a cross-sectional area that is similar to a cross-sectional area of the first plurality of gas channels 212. In some embodiments, the second plurality of gas channels 412 have a cross-sectional area that is smaller than the cross-sectional area of the first plurality of gas channels 212. In some embodiments, the second plurality of gas channels 412 have a cross-sectional area that is larger than the cross-sectional area of the first plurality of gas channels 212.

In some embodiments, the second plurality of gas channels 412 includes a first passageway 416 that extends from each of the one or more second gas inlets 404 towards the second side 202. In some embodiments, the first passageway 416 extends substantially vertically. The second plurality of gas channels 412 includes a plurality of second passageways 420 extending radially outward from each first passageway 416. A plurality of third passageways 422 extend from each of the second passageways 420 towards the plurality of second gas outlets 406. In some embodiments, as shown in FIG. 4, the plurality of third passageways 422 extend substantially vertically from each of the second passageways 420 to the second side 202. In some embodiments, the second plurality of gas channels 412 extend from each of the plurality of third passageways 422 in a manner similar to the plurality of third passageways 224 of the first plurality of gas channels 212 as shown and described with respect to FIG. 2.

Figure 5:
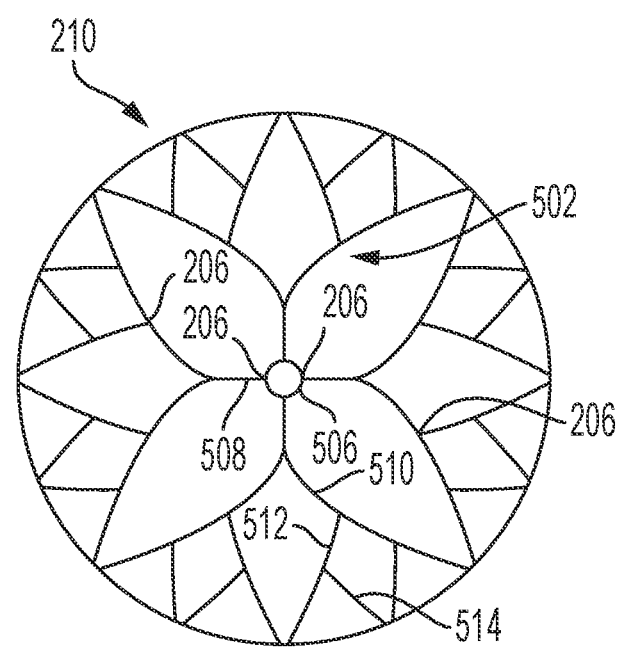
FIG. 5 depicts a schematic cross-sectional bottom view of a lid heater in accordance with some embodiments of the present disclosure.

FIG. 5 depicts a schematic cross-sectional bottom view of a lid heater in accordance with some embodiments of the present disclosure. In some embodiments, radially extending passageways of the heater body 210, for example, the second passageways 220, the fourth passageways 228, or the sixth passageways 232 define internal conduits 502. In some embodiments, the internal conduits 502 are proximate the second side 202. In some embodiments, proximate means closer to the second side 202 than the first side 208. The plurality of first gas outlets 206 are fluidly coupled to the internal conduits 502 via, for example, the third passageway 224 or the seventh passageway 234. The internal conduits 502 are configured to further direct gas flow from vertical extending passageways of the heater body 210, for example, the first passageway 216, the third passageways 224, the fifth passageways 230, to the plurality of first gas outlets 206 across the heater body 210. The internal conduits 502 may be formed via any suitable manufacturing process, for example, machining or lamination.

As shown in FIG. 5, the internal conduits 502 include an annular groove 506 proximate a center of the heater body 210. A plurality of branches extend radially outward form the annular groove 506. In some embodiments, the plurality of branches include a plurality of first branches 508 extending radially outward form the annular groove 506. In some embodiments, the plurality of first branches 508 are four branches. In some embodiments, the plurality of first branches 508 are of equal length. In some embodiments, the plurality of first branches 508 are four branches of equal length. In some embodiments, a plurality of second branches 510 extend radially outward from each of the plurality of first branches 508. In some embodiments, the plurality of second branches 510 are two branches. In some embodiments, the plurality of second branches 510 are of equal length. In some embodiments, the plurality of second branches 510 are two branches of equal length. In some embodiments, a plurality of third branches 512 extend radially outward from each of the plurality of second branches 510. In some embodiments, the plurality of third branches 512 are two branches. In some embodiments, the plurality of third branches 512 are of equal length. In some embodiments, the plurality of third branches 512 are two branches of equal length. In some embodiments, a plurality of fourth branches 514 extend radially outward from each of the plurality of third branches 512. In some embodiments, the plurality of fourth branches 514 are two branches. In some embodiments, the plurality of fourth branches 514 are of equal length. In some embodiments, the plurality of fourth branches 514 are two branches of equal length.

Figure 6:
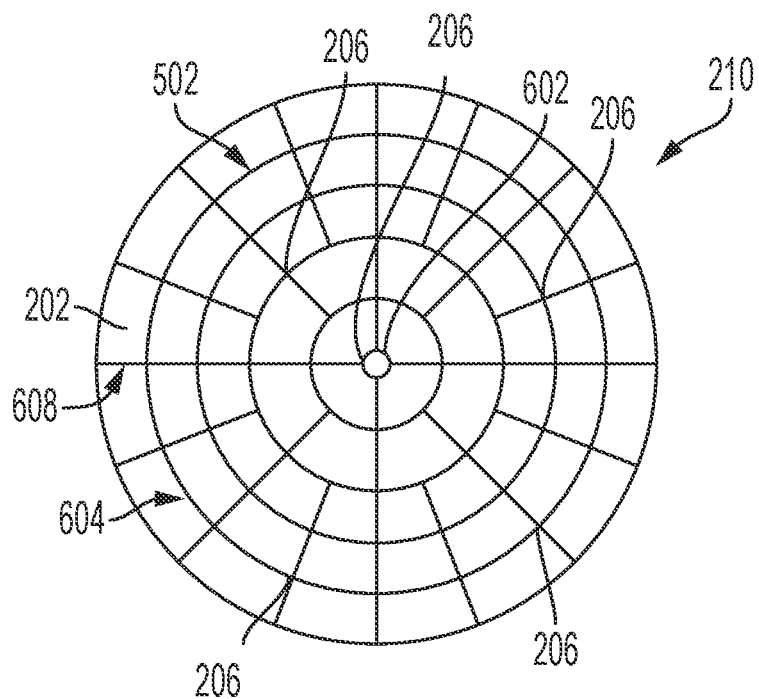
FIG. 6 depicts a schematic cross-sectional bottom view of a lid heater in accordance with some embodiments of the present disclosure.

FIG. 6 depicts a schematic cross-sectional bottom view of a lid heater in accordance with some embodiments of the present disclosure. As shown in FIG. 6, the internal conduits 502 include an annular groove 602 proximate a center of the heater body 210. In some embodiments, the internal conduits 502 include a plurality of concentric grooves 604 disposed radially outward of the annular groove 602. In some embodiments, the internal conduits 502 include a plurality of radial grooves 608 extending between two or more of the plurality of concentric grooves 604. In some embodiments, at least some of the plurality of radial grooves 608 extend between the annular groove 602 and the plurality of concentric grooves 604.

Figure 7:
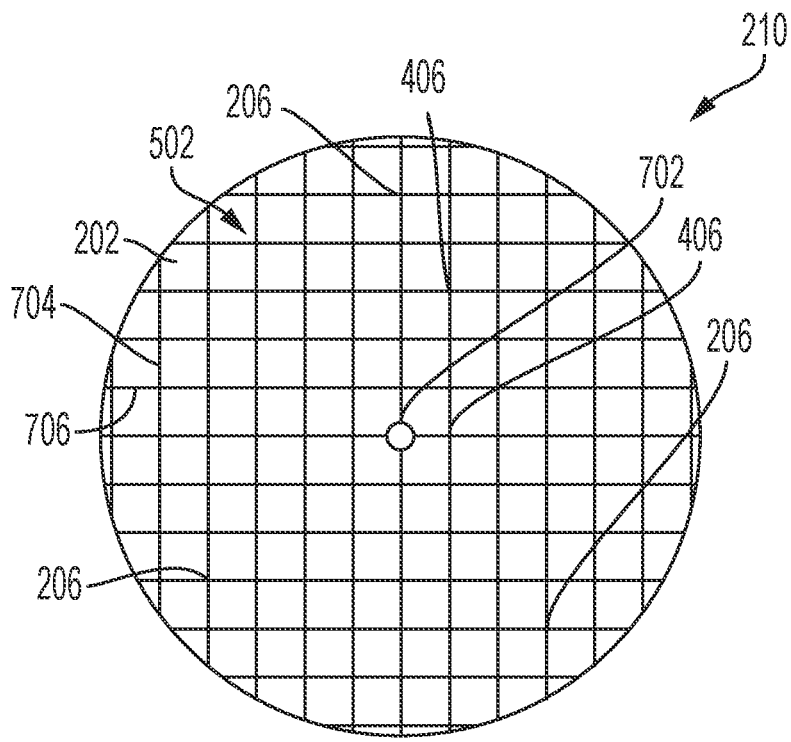
FIG. 7 depicts a schematic cross-sectional bottom view of a lid heater in accordance with some embodiments of the present disclosure.

FIG. 7 depicts a schematic cross-sectional bottom view of a lid heater in accordance with some embodiments of the present disclosure. In some embodiments, the internal conduits 502 include an annular groove 702 proximate a center of the heater body 210. In some embodiments, the internal conduits 502 are arranged in an orthogonal pattern about the annular groove 702. For example, the internal conduits 502 include a plurality of first grooves 704 that are substantially parallel to each other. In some embodiments, the internal conduits 502 include a plurality of second grooves 706 that are substantially parallel to each other and substantially perpendicular to the plurality of first grooves 704. In some embodiments, the plurality of first grooves 704 are disposed at regular intervals across the heater body 210. In some embodiments, the plurality of second grooves 706 are disposed at regular intervals across the heater body 210.

Figure 8A:
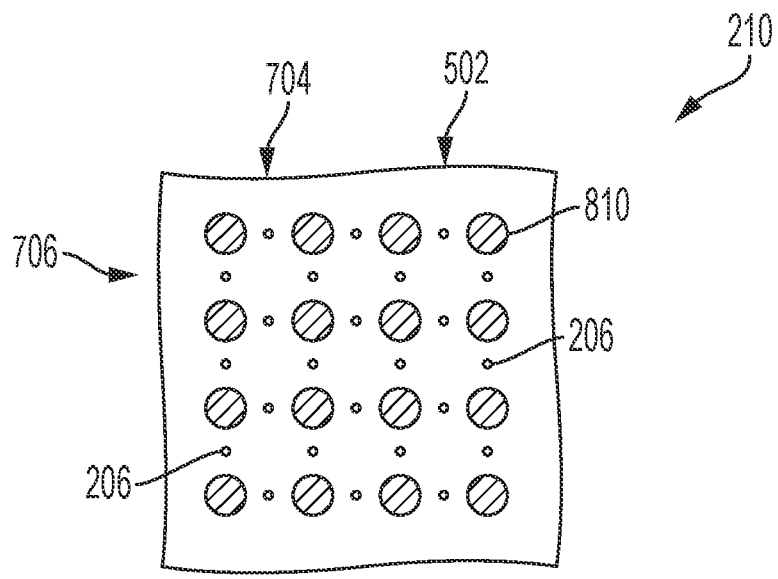
FIG. 8A depicts a top cross-sectional view of a portion of a lid heater in accordance with some embodiments of the present disclosure.
Figure 8B:
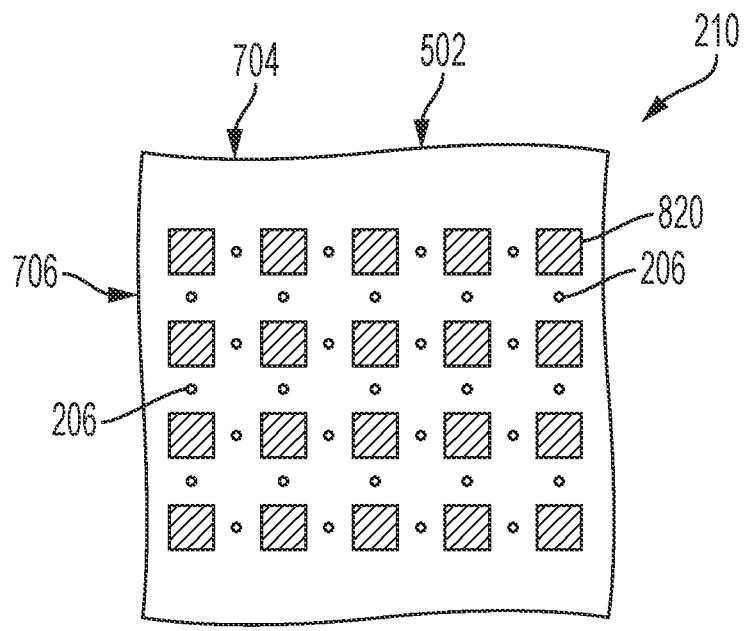
FIG. 8B depicts a top cross-sectional view of a portion of a lid heater in accordance with some embodiments of the present disclosure.

FIG. 8A and FIG. 8B depict top cross-sectional views of a portion of a lid heater in accordance with some embodiments of the present disclosure. In some embodiments, the plurality of first grooves 704 and the plurality of second grooves 706 are defined by a plurality of posts. In some embodiments, as shown in FIG. 8A, a plurality of posts 820 have a circular cross-section. The plurality of posts may have any suitable cross-sectional shape. In some embodiments, as shown in FIG. 8B, a plurality of posts 810 have a rectangular, or square, cross-section.

While the foregoing is directed to embodiments of the present disclosure, other and further embodiments of the disclosure may be devised without departing from the basic scope thereof.

The invention claimed is:

1. A lid heater for a deposition chamber, comprising:
a ceramic heater body having a first side opposite a second side, wherein the ceramic heater body includes a first plurality of gas channels extending from one or more first gas inlets on the first side, wherein each of the one or more first gas inlets extends to a plurality of first gas outlets on the second side;
a heating element embedded in the ceramic heater body; and
an RF electrode embedded in the ceramic heater body proximate the second side such that the RF electrode is not exposed to a process volume facing surface of the lid heater, wherein the first plurality of gas channels extend through the RF electrode.

2. The lid heater of claim 1, wherein the first plurality of gas channels includes a first passageway extending substantially vertically from the one or more first gas inlet towards the second side, a plurality of second passageways extending radially outward from the first passageway, and a plurality of third passageways extending from each of the second passageways to the plurality of first gas outlets.

3. The lid heater of claim 1, wherein the RF electrode comprises a conductive mesh.

4. The lid heater of claim 1, wherein the RF electrode is disposed about 0.5 mm to about 1.5 mm from the second side.

5. The lid heater of claim 1, wherein the first plurality of gas channels have a circular cross-section.

6. The lid heater of claim 1, wherein at least one of:
the first plurality of gas channels have a diameter of about 2.0 mm to about 12.0 mm, or
the first gas outlets have a diameter of about 0.02 inches to about 0.10 inches.

7. The lid heater of claim 1, wherein the ceramic heater body includes internal conduits and the plurality of first gas outlets fluidly coupled to the internal conduits via a plurality of passageways.

8. The lid heater of claim 1, further comprising a second plurality of gas channels extending from a second gas inlet on the first side to a plurality of second gas outlets on the second side.

9. The lid heater of claim 8, wherein the plurality of second gas outlets are disposed radially inward of the plurality of first gas outlets.

10. A substrate processing apparatus, comprising:
a lid heater having a ceramic heater body made entirely of a ceramic material and having a first side opposite a second side, wherein the ceramic heater body includes a first plurality of gas channels extending from one or more first gas inlets on the first side to a plurality of first gas outlets on the second side, wherein the first plurality of gas channels includes a first passageway extending substantially vertically from each of the one or more first gas inlets towards the second side, a plurality of second passageways extending horizontally outward from each first passageway, and a plurality of third passageways extending from each of the plurality of second passageways towards the plurality of first gas outlets;
an RF electrode embedded in the ceramic heater body proximate the second side, wherein the first plurality of gas channels extend through the RF electrode; and
a heating element embedded in the ceramic heater body.

11. The apparatus of claim 10, wherein the RF electrode is a conductive plate with openings or a conductive mesh.

12. The apparatus of claim 11, wherein the heating element is disposed between the RF electrode and the first side.

13. The apparatus of claim 10, wherein the first plurality of gas channels include a plurality of fourth passageways that extend horizontally outward from the each of the plurality of third passageways, a plurality of fifth passageways that extend substantially vertically from each of the plurality of fourth passageways, a plurality of sixth passageways that extend horizontally outward from each of the plurality of fifth passageways, and a plurality of seventh passageways that extend from each of the sixth passageways to the plurality of first gas outlets.

14. The apparatus of claim 10, wherein the first plurality of gas channels have a rectangular cross-section.

15. A deposition chamber, comprising:
a process chamber having a chamber lid and defining a processing volume therein;
a support pedestal disposed in the processing volume to support a substrate;
a lid heater coupled to the chamber lid, wherein the lid heater includes a ceramic heater body coupled to a shaft and extending radially outward from the shaft, the ceramic heater body having a first side opposite a second side and a heating element embedded therein and disposed between the shaft and the second side, wherein the lid heater includes a first gas flow line extending through the shaft and a first plurality of gas channels extending from the first gas flow line to a plurality of first gas outlets on the second side; and
an RF electrode embedded in the ceramic heater body proximate the second side, wherein the first plurality of gas channels extend through the RF electrode.

16. The deposition chamber of claim 15, further comprising a showerhead disposed between and spaced from the support pedestal and the lid heater.

17. The deposition chamber of claim 16, wherein a second gas flow line is coupled to the showerhead.

18. The deposition chamber of claim 15, further comprising a second plurality of gas channels extending from a second gas inlet on the first side to a plurality of second gas outlets on the second side.

19. The deposition chamber of claim 15, wherein the ceramic heater body includes internal conduits disposed between the RF electrode and the heating element, and wherein the internal conduits include an annular groove.

20. The deposition chamber of claim 19, wherein the internal conduits are arranged in an orthogonal pattern about the annular groove.

* * * * *